(12) United States Patent
Houston

(10) Patent No.: US 7,619,947 B2
(45) Date of Patent: Nov. 17, 2009

(54) INTEGRATED CIRCUIT HAVING A SUPPLY VOLTAGE CONTROLLER CAPABLE OF FLOATING A VARIABLE SUPPLY VOLTAGE

(75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 278 days.

(21) Appl. No.: 11/930,979

(22) Filed: Oct. 31, 2007

(65) Prior Publication Data
US 2009/0109764 A1   Apr. 30, 2009

(51) Int. Cl.
*G11C 5/14* (2006.01)
(52) U.S. Cl. .................. 365/229; 365/228; 365/227; 365/189.09; 365/156; 365/230.03
(58) Field of Classification Search ............... 365/156, 365/154, 189.09, 229, 228, 227, 226, 230.03
See application file for complete search history.

(56) References Cited

U.S. PATENT DOCUMENTS

| | | | | |
|---|---|---|---|---|
| 6,795,332 B2 * | 9/2004 | Yamaoka et al. | ............ | 365/154 |
| 7,164,596 B1 * | 1/2007 | Deng et al. | ................. | 365/154 |
| 7,466,581 B2 * | 12/2008 | Huang et al. | ................. | 365/154 |
| 7,564,725 B2 * | 7/2009 | Houston | ................. | 365/189.09 |
| 7,589,991 B2 * | 9/2009 | Masuo | ....................... | 365/154 |
| 2007/0025162 A1 | 2/2007 | Deng et al. | | |

* cited by examiner

*Primary Examiner*—Andrew Q Tran
(74) *Attorney, Agent, or Firm*—Jacqueline J. Garner; Wade J. Brady, III; Frederick J. Telecky, Jr.

(57) ABSTRACT

An integrated circuit includes a supply voltage controller operable to receive a plurality of control signals and at least one circuit supply voltage and to output at least one variable supply voltage to at least one supply terminal of the integrated circuit The controller is operable to switch the variable supply voltage to a first voltage level when the control signals define a first operation and to a second voltage level different from the first voltage level when the control signals define a second operation. The controller is also operable to float the variable supply voltage to a third voltage level different from the first voltage level when the control signals define a third operation.

25 Claims, 5 Drawing Sheets

US 7,619,947 B2

INTEGRATED CIRCUIT HAVING A SUPPLY VOLTAGE CONTROLLER CAPABLE OF FLOATING A VARIABLE SUPPLY VOLTAGE

FIELD OF INVENTION

The present invention relates generally to semiconductor devices and more specifically, to integrated circuits having variable power supply circuitry.

BACKGROUND OF THE INVENTION

Current trends in the semiconductor and electronics industry require semiconductor devices to be made smaller, faster and require less power consumption. One reason for these trends is that more personal devices are being manufactured that are relatively small and portable, thereby relying on battery power. In addition to being smaller and more portable, personal devices are also requiring increased memory, computational power, and speed. In light of all these trends, there is an ever increasing demand in the industry for integrated circuits which are smaller, faster, and have lower power dissipation. For minimizing integrated circuit power consumption, it is generally desirable for the total power supply voltage to be as low as possible. However, in the case of some types of semiconductor circuits, changes in the power supply voltage must still support stable operation of the circuit.

Semiconductor memory cells can, for example, be characterized as volatile random access memories (RAMs) or non-volatile read only memories (ROMs), where RAMs can either be static (SRAM) or dynamic (DRAM) differing mainly in the manner by which they store a state of a bit. The basic CMOS SRAM cell generally includes two n-type or n-channel (NMOS) pull-down or drive transistors and two p-type (PMOS) pull-up or load transistors in a cross-coupled inverter configuration, with two additional NMOS select or pass-gate transistors added to make up a standard double-sided or differential six-transistor memory cell (a DS 6T SRAM cell, a 6T SRAM cell, or simply a 6T cell). 8 transistor, 9 transistor, 5 transistor and 4 transistor SRAM cells are also known. Additionally, application specific SRAM cells can include an even greater number of transistors. A plurality of transistors are utilized in SRAM requiring matched electrical characteristics to provide predictable cell switching characteristics, reliable circuit performance, and minimize array power dissipation.

FIG. 1 is schematic of a conventional differential SRAM 6T cell 100. As illustrated, the SRAM cell 100 comprises a data storage cell or latch 102, generally including a pair of cross-coupled inverters, for example, inverter 112, and inverter 114, the latch 102 operable to store a data bit state. FIG. 1 illustrates that the bit is stored in the latch 102 at the data nodes or first and second latch nodes 104 and 106, respectively, having a high or "1" state and a low or "0" state, respectively. Cell 100 also comprises a pair of wordline pass transistors 116, 118 to read and write the data bit between the cross-coupled inverters 112, 114 and bitlines BL 130, BL-bar 132, when enabled by wordline 134.

Respective inverters 112, 114 comprise a p-type MOS (PMOS) pull-up or load transistor Q1 120, Q2 122 and an n-type (NMOS) pull-down transistor Q3 124, Q4 126. Pass gates (e.g., transistors) Q5 116, Q6 118 are n-channel as well, which generally supply higher conductance as compared to p-channel transistors. Pass transistors 116, 118 are enabled by wordline 134 and accessed by bitlines 130, 132 to set or reset the SRAM latch 100. FIG. 1 further illustrates that inverters 112, 114 of the SRAM memory cell 100 are connected together to a high voltage power supply (VDD) terminal 140 and a low voltage power supply (VSS) terminal 150. Both VDD and VSS are generally configured to provide fixed voltage levels, such as 1.2 Volts and 0 Volts, respectively. A VDD for an array is generally referred to as VDDM. Similarly, a VSS for an array is generally referred to as VSSM.

In general, SRAM cells must be stable when accessed for a read operation, yet must be able to be switched from one state to the other for a write operation. Also, unaddressed cells must be stable during a write operation. These somewhat conflicting requirements for stability and write ability must be met over a range of voltages and temperature conditions. What is needed is circuitry that minimizes power consumption and permits stable circuit operations without degrading performance.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

In a first embodiment of the invention, an integrated circuit can include a supply voltage controller operable to receive a plurality of control signals and at least one circuit supply voltage and to output at least one variable supply voltage to at least one supply terminal of the integrated circuit. The controller is operable to switch the variable supply voltage to a first voltage level when the control signals define a first operation and to a second voltage level different from the first voltage level when the control signals define a second operation, and where the controller is operable to float the variable supply voltage to a third voltage level different from the first voltage level when the control signals define a third operation.

In a second embodiment of the invention, a method of operating an integrated circuit can include the steps of applying a first voltage level when a plurality of control signals define a read operation and a second voltage level different from the first voltage level when the control signals define a write operation to a supply voltage terminal of the integrated circuit, and floating the variable supply voltage terminal to a third voltage level when the plurality of control signals define a standby state.

In a third embodiment of the invention, an integrated circuit can include a memory array comprising plurality of SRAM memory cells arranged in a plurality of rows and columns, the array also having a plurality of word lines for accessing rows of cells and a plurality bit lines for accessing columns of cells. A supply voltage controller is operable to receive control signals indicating a read operation or write operation and at least one circuit supply voltage and to output at least one variable supply voltage to a supply terminal of the memory cells, where the supply controller is further operable to switch the variable supply voltage to a first voltage level when the control signals indicate the read operation and to a second voltage level different from the first level when the control signals define the write operation, and to float the variable supply voltage to a third voltage level when the control signals indicate a standby state for the memory cells.

DETAILED DESCRIPTION

Figure 1:
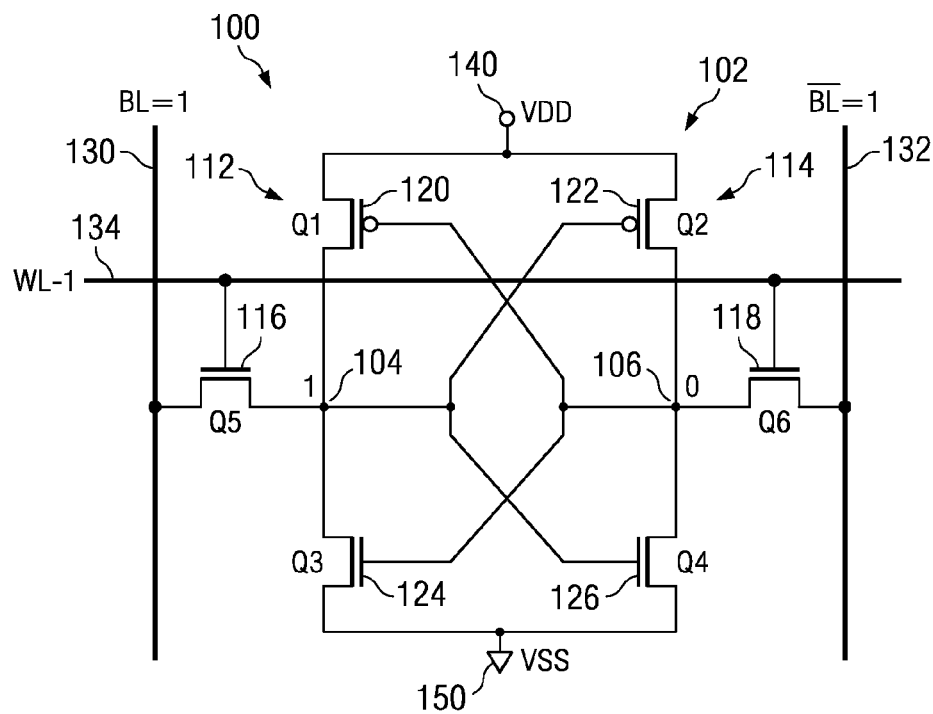
FIG. 1 is a schematic diagram of a conventional differential 6T static random access memory (SRAM) cell.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit according to an embodiment of the invention includes a supply voltage controller for providing a variable supply voltage and a memory array comprising a plurality of memory cells. The memory cells can be arranged in a plurality of blocks, such as sub-arrays, rows, or columns. Although memory cells are generally described herein as comprising SRAM cells, the invention is also applicable to other types of memory cells including but not limited to DRAM, FeRAM, and MRAM memory cells. More generally, one of ordinary skill in the art will recognize that the various embodiments of the supply voltage controller described herein can also be used to benefit non-memory comprising integrated circuit designs for those circuits having one or more circuit portions that can benefit from fast or floating supply voltage transitions.

In some embodiments, the memory array can have a plurality of word lines for accessing rows of cells and a plurality bit lines for accessing columns of cells. The array can include at least one driver or controller for driving the plurality of word lines to a word line voltage (VWL) and for driving the plurality of bit lines to a bit line voltage (VBL). A low supply voltage for the array (VSSM) can be coupled to a low voltage supply terminal of the memory cells, and a high voltage supply for the array (VDDM) can be coupled to a high voltage supply terminal of the memory cells.

Embodiments of the present invention provide a supply voltage controller for providing a variable VDDM and VSSM. In particular, embodiments of the present invention can enhance the operation of a memory array by providing a supply voltage controller for the array that switches VSSM and/or VDDM to first voltage level(s) for a read operation and to a second voltage level(s) for a write operation. This mode of operation reduces power consumption by floating the voltage for VSSM and/or VDDM to a standby level, rather than driving the voltages to particular standby levels using a power-consuming shift during a standby or inactive state of operation. Furthermore, the various embodiments can also allow a selectable option of a fast voltage transition or a float voltage transition for VDDM and/or VSSM.

Figure 2A:
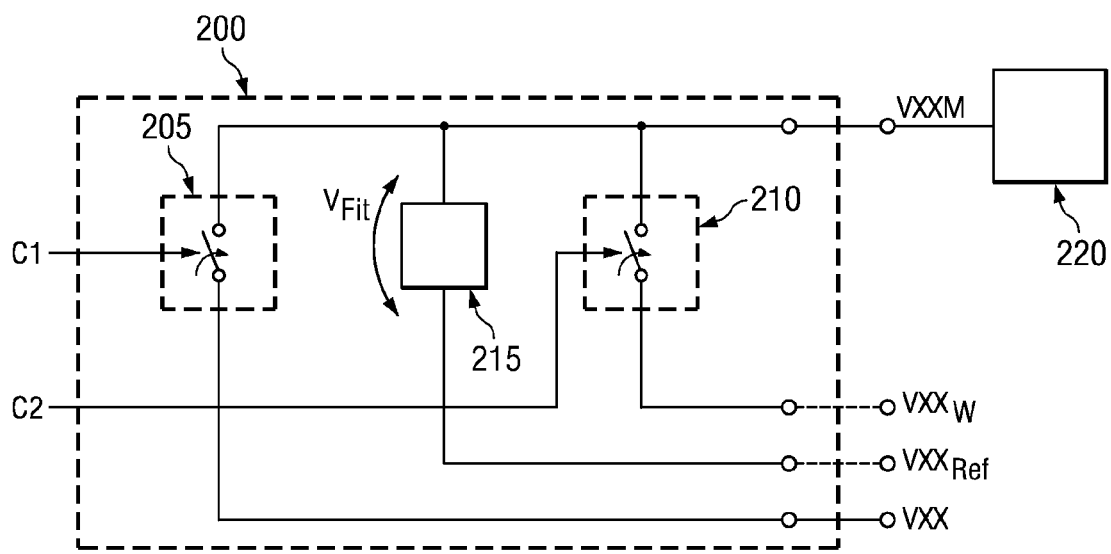
FIG. 2A shows a functional schematic of a supply voltage controller according an embodiment of the present invention.

A functional schematic of an exemplary supply voltage controller for selectively choosing a fast or a floating voltage transitions for outputting a variable supply voltage is shown in FIG. 2A. As shown in FIG. 2A, controller 200 accepts a plurality of control signals, such as digital (hi or low) control signals C1, C2 to control the output supply voltage to a logic, memory, or other portion 220 of an integrated circuit requiring a variable power supply voltage. In the case of a memory cell, the control signals can include a read signal R and a write signal W to indicate read and write operations. The control signals C1, C2 control at least first and second switching elements 205, 210 that can be used to bias the output VXXM to a first voltage (VXX) or to a second voltage (VXX$_W$). In the case of a memory cells, the first and second voltages correspond to read and write voltages levels for a voltage supply, respectively. A variety of voltage differences between VXX$_W$ and VXX can generally be used. However, in certain embodiments of the invention, to provide stable operation of an SRAM, a difference between VXX and VXX$_W$ of 100-400 mV may be required.

A third switching element can be provided to force VXXM to a third voltage, such as a standby voltage for a SRAM cell. However, additional active switching generally results in increased power consumption if the voltage is actively switched from the other of the two voltages to the third voltage and additional circuitry would also be required to create a third control signal. Instead, in one embodiment of the invention, the invention defines a third state or a third operation by the lack of active control signals. In this embodiment, during the third state or operation, the first and second switching elements 205, 210 are inactive and additional circuitry is provided to provide a low-power transition from a first or second voltage to the third voltage. In other words, power consumption can be reduced by allowing VXXM to float up or down to a third voltage, such as the standby VXXM for a SRAM cell. The standby VXXM for an SRAM cell can generally be any voltage, but the difference between the standby VXXM and $VXX_W$ is typically less than 200 mV. In some embodiments, the standby voltage can be substantially equal to one of the first and second voltages (i.e., <100 mV difference).

For an SRAM cell, the third element 215 can be a float element placed between VXXM and a reference voltage ($VXX_{Ref}$) to provide the standby voltage, where the output voltage is the sum of the voltage drop ($V_{Flt}$) across third element 215 and $VXX_{Ref}$. The third element 215 can comprise a voltage drop element, such as a single diode, a "diode connected" MOS transistor, a low-drop-out voltage regulator, a high-drop-out voltage regulator, any type of resistor, or any combinations thereof. As used herein, the term "diode" will be understood to include both conventional diodes and "diode connected" MOS transistors. By way of example and not limitation, an exemplary configuration of a "diode connected" MOS transistor is a MOS transistor having the gate coupled to the drain, which forces the MOS transistor into a saturation mode to approximate current-voltage (I-V) characteristics of a conventional diode.

FIG. 2A shows three separate supply voltages, VXX, $VXX_W$, and $VXX_{Ref}$. However, this functional schematic is provided only for illustrative purposes and one of ordinary skill in the art will recognize that one or more of VXX, $VXX_W$, and $VXX_{Ref}$ can be combined or associated to reduce the number of supply voltages provided to a controller and still provide a selectable option between a fast or a floating voltage transition. The configuration for the controller can vary and variations for controllers can be provided in the various embodiments of the present invention. For example, as previously described, VXX and $VXX_{Ref}$ can be the same voltage. In another example, $VXX_{Ref}$ and $VXX_W$ can be generated within controller 200 by various means known in the art. Thus, multiple controllers 200 can be combined to generate multiple supply voltages for multiple circuit portions for multiple memory cells in a memory array. In some embodiments of the invention for providing variable supply voltages to SRAM cells, any number of supply voltage levels can be received and/or output by the controller 200. However, some minimum voltage depending on the technology can be required between the high voltage supply and low voltage supply to ensure stable operation of the SRAM cell.

Figure 2B:
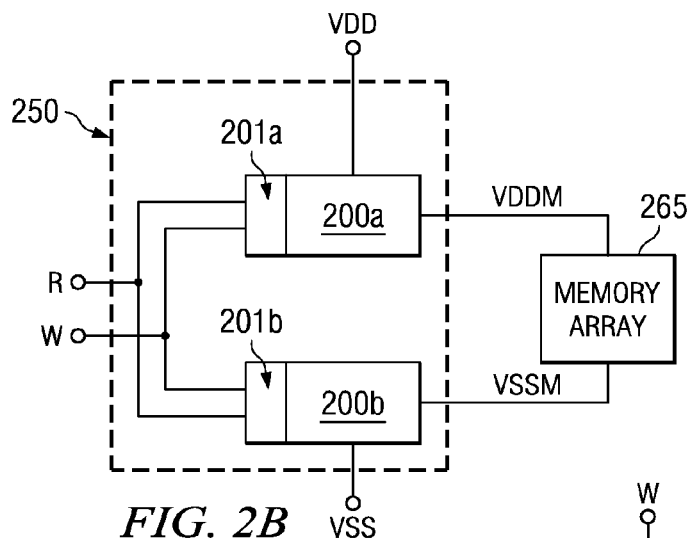
FIG. 2B shows a schematic of a supply voltage controller for a memory array according an embodiment of the present invention.

A schematic of an exemplary embodiment of a supply voltage controller 250 for VDDM and VSSM for an SRAM array is shown in FIG. 2B. In FIG. 2B, a first and second controller 200a, 200b are provided to supply VDDM and VSSM, respectively, to memory array 265, based on read and write control signals R, W. One of ordinary skill in the art will recognize that when controlling a VDDM level and a VSSM level, the controllers 200a, 200b for VDDM and VSSM need not be similarly configured. Additionally, the controller can also be configured to provide for only one of VDDM and VSSM. It is also within the scope of the invention to include a pre-processing portions 201a, 201b for a controllers 200a, 200b, respectively, to invert, combine, or otherwise adjust control signals R or W for use with the controllers 200a, 200b for VDDM and VSSM in controller 250.

Figure 3:
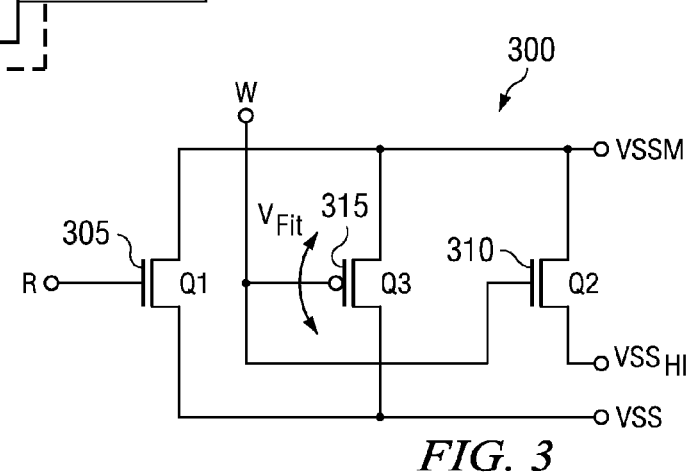
FIG. 3 shows a supply voltage controller for providing a selectable option of a fast or float transition for VSSM using a float MOS transistor coupled to VSS according to an embodiment of the present invention.

An exemplary embodiment of a controller for selecting between a fast and a floating voltage transition for VSSM is shown in FIG. 3. Generally, it can be desirable to provide a raised VSSM for standby and for write operations, but a low VSSM during a read operation. Although it may be desirable to quickly switch between the voltage levels required for read and write operations to enhance performance, there is generally no advantage to switching quickly to a standby voltage level. Generally, forcing the voltage to switch quickly to the standby voltage may result in higher power consumption if the amount of time an SRAM cell is in a standby state is of limited duration. Therefore, by floating to the standby voltage, i.e., allowing the leakage currents to change the charge and thus the voltage on the capacitance of the supply, power is not expended to reach the standby voltage. Thus, even if the standby voltage and one of the operating voltages are substantially the same voltage level, it can be advantageous to use active switching only for switching to a voltage level during an active operation (e.g. WRITE) and to allow the voltage to float toward a voltage level during standby operations.

To provide the respective VSSM levels during read and write operations, the controller can include a first NMOS transistor Q1 305, controlled by a read control signal (R), connected to VSS and a second NMOS transistor Q2 310, controlled by a write control signal (W), connected to a raised VSS ($VSS_{HI}$). Thus, when a read or write operation takes place, the read or write control signals (R, W) can turn ON the appropriate transistor Q1, Q2 and as a result, force VSSM to VSS or $VSS_{HI}$, respectively. However once the read or write operation is complete, it may be desirable for VSSM to return to a standby VSS level. Controller 300 floats VSSM back to a standby VSSM by using a third or float element 315.

In the embodiment in FIG. 3, float element 315 can be a float PMOS transistor Q3 315. In particular, float transistor Q3 315 can be a PMOS transistor Q3 connected in parallel with the second transistor Q2 310, but with the gate connected to write control signal (W) instead of the read control signal (R). Therefore, during a read operation, R goes high, turning transistor Q1 305 ON. Consequently, VSSM is lowered to VSS, providing the necessary low VSSM level to improve readability. After the read operation is complete and Q1 is turned OFF, the voltage level of VSSM will float up as leakage current in the circuit (memory array) charges the capacitance on VSSM. As VSSM voltage level floats up, Q3 will gradually turn on as its source voltage (VSSM) rises above its gate voltage (W), the current increasing with diode-like characteristics with increasing VSSM. The increasing current through Q3 will limit the upper float voltage of VSSM to the voltage at which the leakage current of the circuit equals the current through Q3. Typically, this occurs when the voltage across Q3 is about equal to its threshold voltage. Those familiar with the art will recognize both that the transition time of VSSM from VSS to the standby VSSM voltage depends on the capacitance on the VSSM node and the VSS current being drawn by the array. Furthermore, the exact value of the VSSM standby voltage will depend on the characteristics of the float device and the current drawn by the array in standby.

Depending on the cell design and the other voltages applied (VDDM, VDD of the word line, and the bit-line voltages), VSSM generally needs to be above some minimum voltage for a successful write. However, waiting for VSSM to rise to the standby VSSM after a read operation is not desirable for high speed access of the SRAM array. The present invention therefore provides in the embodiment in FIG. 3 a fast transition to a raised VSSM if a write operation is required, in particular by turning ON the write transistor Q2 310. During a write operation, when only a write control signal (W) is generated and turns ON transistor Q2 310 and turns OFF float transistor Q3 315. This can quickly pull VSSM up to $VSS_{HI}$ relative to the drift rate when floating, to provide the proper VDDM to ensure a robust write operation, regardless of the current state of float transistor 315. When the write operation is complete and W goes low, transistor 310 is turned OFF and float transistor 315 is turned ON. VSSM will then float to the standby value for VSSM (generally higher than the voltage for the write operation, $VSS_{HI}$) following a write operation. Here the voltage of VSSM in standby will depend on the characteristics of the float transistor 315 and the current drawn by the array in standby.

Although the example operation described above utilizes a $VSS_{HI}$ that is generally less than the standby VSSM, such a relationship is not required for operation of the invention. For example, $VSS_{HI}$ can instead be substantially equal to the standby VSSM value (e.g., within 100 mV or less). In such embodiments, there will be no substantial change in VSSM in the transition from a write operation to a standby state. However, in other embodiments, a cell may have adequate stability and reduced power at one VSSM value and a combination of adequate writeability of addressed cells and adequate stability of unaddressed cells at another VSSM value. Therefore, in these embodiments $VSS_{HI}$ can be different than the standby VSSM to provide the required voltage levels. Additionally, $VSS_{HI}$ can be either supplied to the controller separately or can be generated from VSS or from VDD. For example, $VSS_{HI}$ can be generated from VSS by using a pull-up transistor, resistor, diode or other component to generate a voltage difference between VSS and $VSS_{HI}$.

As previously noted, using a PMOS transistor is only one possible structure for providing a float element. Other types of circuits, including one or more diodes, active resistors, LDO's, or any combination thereof, can be similarly used to provide a float element for VSSM to allow for selectively choosing between a fast or a float transition for VSSM.

Figure 4:
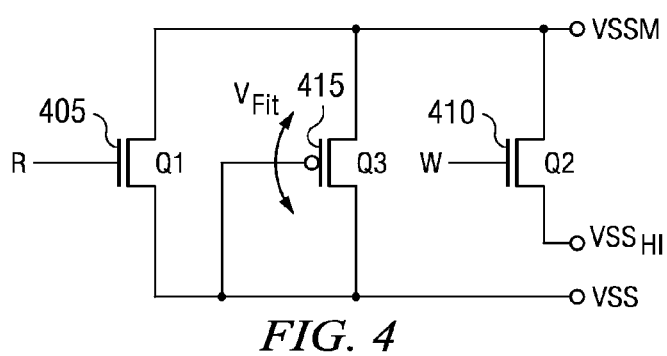
FIG. 4 shows a supply voltage controller for providing a selectable option of a fast or float transition for VSSM using a single MOS "diode" coupled to VSS according to an embodiment of the present invention.

An exemplary embodiment of a controller for selecting between a fast and a floating voltage transition for VSSM using a diode connected MOS transistor is shown in FIG. 4. Although FIG. 4 illustratively shows a diode connected PMOS transistor Q3 415 having its gate and drain coupled to VSS, those of ordinary skill in the art will recognize that an NMOS transistor having its gate and drain tied to VSSM would provide similar I-V characteristics. Furthermore, it is within the scope of the present invention to use any arrangement of one or more MOS transistors that approximate conventional diode I-V characteristics.

Controller 400 can also include a structure similar to that shown in FIG. 3, namely a first transistor Q1 405 coupling VSS and VSSM controlled by a read control signal (R) and a second transistor Q2 410 coupling $VSS_{HI}$ to VSSM and controlled by a write control signal (W). The operation of the transistors Q1 405, Q2 410 is generally the same as that described above for transistors 305, 310 in FIG. 3. However, rather than using a transistor gated by a control signal such as R or W, the controller 400 in FIG. 4 can instead couple VSS to VSSM via a float element 415 comprising diode connected PMOS transistor Q3. In the standby mode, the float transistor 415 of FIG. 4 acts like the float transistor 315 of FIG. 3, allowing VSSM to float from VSS or $VSS_{HI}$ to a standby VSS, namely the sum of voltage drop ($V_{Flt}$) between the source and drain of the PMOS transistor Q3 and VSS. One difference is that the float transistor 415 is not turned OFF when W is high. However, having transistor 415 ON with W high is generally not an issue if $VSS_{HI}$ is lower than the standby value for VSSM. If $VSS_{HI}$ is higher than the standby value for VSSM, then having transistor 415 ON with W high can add to leakage current. For a read operation, VSSM can be pulled down to VSS so that having 415 ON during a read operation is not generally an issue.

As previously described, waiting for VSSM to rise to the standby VSSM for a write operation following a read operation is generally not desirable for high speed access of the SRAM array. The present invention also provides in the embodiment shown in FIG. 4 a fast transition to a raised VSSM if a write operation is required, in particular the write transistor Q2 410. During a write operation W can go HIGH and turn ON transistor Q2 410. This can quickly pull VSSM up to $VSS_{HI}$ to provide the proper VDDM to ensure a robust write operation, regardless of the current state of the float transistor Q3. After the write operation is complete and W goes LOW, the float transistor Q3 415 can then allow VSSM to float up to the standby voltage or pull VSSM down to the standby voltage, depending on whether $VSS_{HI}$ is lower or higher than the standby voltage for VSSM, or simply maintain VSSM at the standby voltage if $VSS_{HI}$ is substantially equal to the standby voltage for VSSM.

Figure 5:
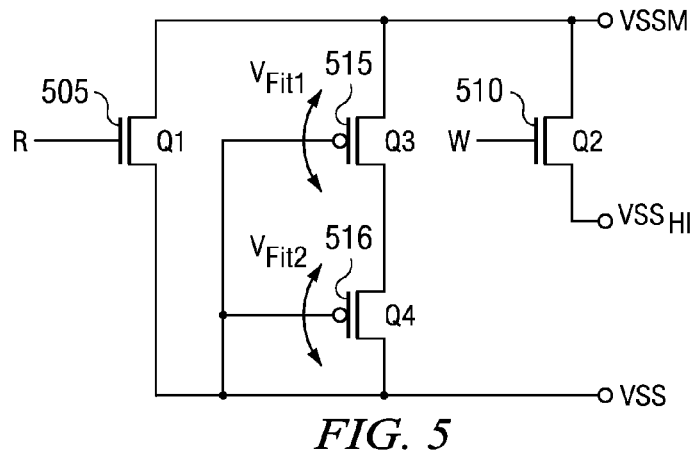
FIG. 5 shows a supply voltage controller for providing a selectable option of a fast or float transition for VSSM using two MOS "diodes" coupled to VSS according to an embodiment of the present invention.

In some embodiments, one being shown in FIG. 5, more than one diode can be used. As shown in FIG. 5, controller 500 can include two diodes 515, 516 coupled in series between VSS and VSSM. In controller 500, the diodes can comprise diode connected PMOS transistors Q3, Q4, each having its gate coupled to VSS. As in the controller 400, the PMOS transistor Q4 in controller 500 is also forced into saturation by; coupling its drain and gate to VSS. The connection of Q3 is less common in that Q4 is between the gate and the drain. Nevertheless, Q3 also will exhibit diode like characteristics. In operation, the two resulting diodes 515, 516 can generate a voltage drops ($V_{Flt1}$, $V_{Flt2}$) across each of the diodes 515, 516. Thus, VSSM is then the sum of these voltage drops ($V_{Flt1}$, $V_{Flt2}$) and VSS. Proper VSSM values for read and write operations can be provided via transistors Q1 505 and Q2 510, as previously described in FIGS. 3 and 4.

Designs using multiple elements to set the standby voltage can be more flexible than designs with a single element in meeting the target voltage over a range of conditions including temperature, supply voltages, and process parameters. The circuit to provide a float to a standby voltage can include a variety of elements in series or in parallel connections. The elements can include, but are not limited to, active or passive elements such as transistors, diodes, or resistors. Furthermore, the circuit can include any combination of passive and active elements.

In operation, the controllers shown in FIGS. 3-5 all operate based on the availability of a control signal throughout the time during which VSSM is to be held at a particular voltage for a read or write operation. For example, a write operation forces W high, raising VSSM to a $VSS_{HI}$ during the write operation. However, in some embodiments, it is not necessary for the signal to the controller to remain high during the entire duration of the write operation, especially in cases where the standby VSSM is sufficient to ensure writeability and stability for the memory cells. In such cases, a high signal, such as a pulse signal generated at the start of a write operation, can be provided for a brief time sufficient to bring VSSM to a value adequate for a write operation, and the float element can maintain VSSM at an adequate voltage for the remainder of the write operation. Such a configuration can generate a sufficiently high VSSM without having to actively provide a high W throughout the write operation, further reducing power consumption of the SRAM. The pulse circuit can raise VSSM by pulling against the float element, or can raise VSSM to (or toward) some supply voltage, e.g. $VSS_{HI}$ or VDD, with the float element turned off. Having the pulse circuit pull against the float element has the advantage of eliminating the need to switch the float element and also does not require a separate supply voltage such as $VSS_{HP}$, but may incur some inaccuracy in the voltage obtained by the pulse.

Figure 6:
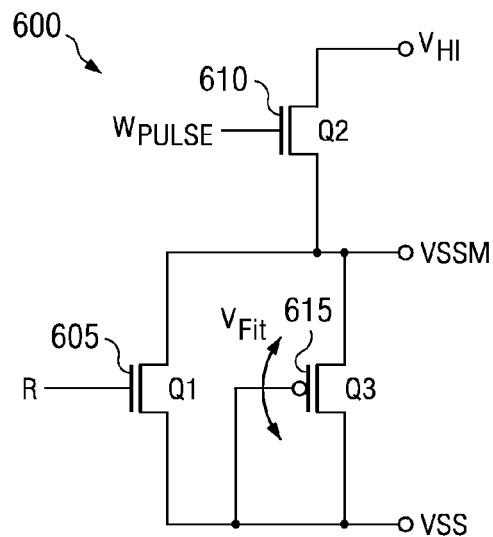
FIG. 6 shows a supply voltage controller for providing a selectable option of a fast or float transition for VSSM using a single MOS "diode" coupled to VSS and a high voltage write pulse according to an embodiment of the present invention.

An exemplary embodiment for such a controller is shown in FIG. 6. FIG. 6 shows a controller 600 similar to that shown in FIG. 4. As in FIG. 4, the controller 600 includes a read transistor Q1 605, a write transistor Q2 610, and a float element 615 comprising a MOS diode Q3. However, rather than using W to turn ON the write transistor Q2 610, the circuit of FIG. 6 can use a $W_{pulse}$ signal to momentarily provide current to raise VSSM. The pulse of current that is provided when $W_{pulse}$ is high raises VSSM as the current goes though transistor Q3. Therefore, $W_{pulse}$ generally needs to be of sufficient length and sufficient voltage to ensure that enough charge is provided so that VSSM reaches a sufficient voltage to provide a robust write operation. This voltage may be less than or substantially equal to the voltage that will be maintained by the float element Q3. If, at the beginning of the write operation, VSSM is already at the voltage that is maintained by the float element, such as may be the case if the write operation follows a preceding write operation or follows a standby state, the additional momentary current is discharged with only a slight increase in VSSM due to the diode characteristics of Q3. Optionally, the pulse signal $W_{pulse}$ can be suppressed for write operations following a write operation or for write operations following standby. Thus, the amount of power required during a write operation is reduced compared to continually pulling VSSM high against a float element for the duration of the write operation, reducing over power consumption.

As previously noted, the present invention is not limited to selecting between a fast and float transition for VSSM and can also be applied to controllers for selecting between a fast and float transition for VDDM. In the case of VDDM, it may be desirable to have a lowered VDDM during standby. However, during a read operation or for unaddressed columns during a write operation it is desirable to have a high VDDM. However, if VDDM is allowed to float down to a standby VDDM, the same problem arises as for VSSM, namely that VDDM may be too high, i.e. floating down too slowly, to ensure writeability and stability. Therefore, a similar type of circuit is needed for VDDM. Several exemplary embodiments for these circuits are illustrated in FIGS. 7-11. However, in order to better show the similarities between the various embodiments for VDDM and VSSM control circuits, the usual convention of drawing the highest voltage level at the top of the drawing is not followed in FIGS. 7-11.

Figure 7:
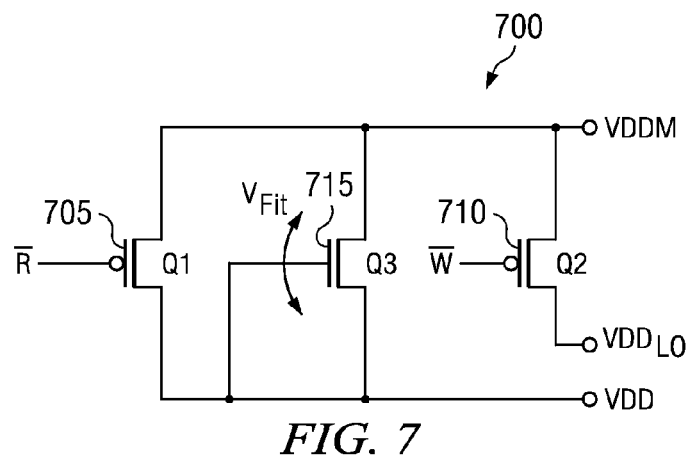
FIG. 7 shows a supply voltage controller for providing a selectable option of a fast or float transition for VDDM using a single MOS "diode" coupled to VDD according to an embodiment of the present invention.

One exemplary controller circuit 700 according to an embodiment of the invention is shown in FIG. 7. Controller 700 includes a read transistor Q1 705 coupling VDD to VDDM controlled by a read complement signal and a write transistor Q2 710 comprising a second PMOS transistor coupling a $VDD_{LO}$ to a VDDM controlled by a write complement signal. Controller 700 thus operates inversely to controller 400. That is, VDDM is increased in response to R going high (R-bar going low) and VDDM is decreased in response to W going high (W-bar going low). Controller 700 provides such functionality by using inverted control signals (R-bar, W-Bar) in conjunction with PMOS transistors Q1 705 and Q2 710. Inverted control signals can be provided to the controller or can be generated using a pre-processing portion, as previously discussed. Thus, when R goes high, the read transistor Q1 705 receives an inverted signal, R-bar, and turns ON, forcing VDDM to VDD. Similarly, when W goes high, the write transistor Q2 710 receives an inverted signal, W-bar, and turns on, forcing VDDM to $VDD_{LO}$. This allows VDDM to be forced to the appropriate VDDM during a read or a write operation, just as the circuit for VSSM provides in FIG. 4.

Consequently, in order to provide a proper float element 715 to lower VDDM to a standby VDDM, float transistor Q3 is provided to couple VDDM to VDD, as shown in FIG. 7. Float transistor Q3 715 can be an NMOS transistor also having a drain and gate coupled to VDD, forming an active resistor with diode-like I-V characteristics. Those of ordinary skill in the art will recognize that a PMOS transistor having its gate and drain tied to VDDM would provide a similar I-V characteristics. Thus, after VDDM is raised by an R-bar signal to VDD, the float transistor Q3 can allow the capacitance on VDDM to discharge through the array as limited by transistor Q3. The current through Q3 creates a voltage drop ($V_{Flt}$) and VDDM is $V_{flt}$ below VDD. Eventually VDDM floats down to a desired standby VDDM.

Depending on the cell design and the conditions including temperature, bit line voltages, word line voltage, VSSM, and process variations, VDDM is generally some minimum amount below VDD (the asserted word line voltage generally being VDD) to assure a robust write operation. Therefore, the characteristics of Q3 can be selected to optimize the voltage drop. For example, in some alternate embodiments; the drain of Q3 can be connected to some reference voltage other than VDD. However, when such a lowering of VDDM is required, waiting for VDDM to float down to the standby VDDM prior to writing is not desirable for high speed access of the SRAM array. The present invention therefore provides in the embodiment in FIG. 7 a fast transition to a low VDDM. In particular, a write operation results in W-bar going low and turning ON transistor 710. This quickly pulls VDDM down to $VDD_{LO}$ relative to the delay for floating down, and provides a robust write operation, regardless of the value of VDDM or the state of float transistor 715 at the start of the write operation. If the value of VDDM for the write operation is higher than the desired value for VDDM in standby, VDDM can float down to the standby value of VDDM, as limited by the float transistor 715, after the write operation is complete.

Figure 8:
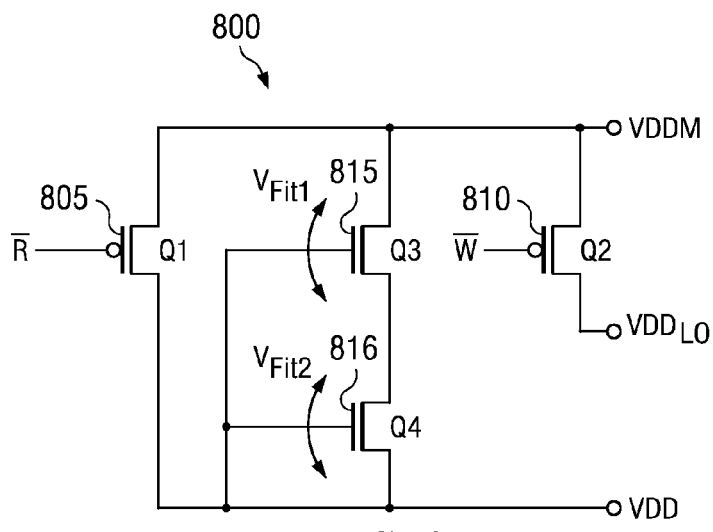
FIG. 8 shows a supply voltage controller for providing a selectable option of a fast or float transition for VDDM using two MOS "diodes" to VDD according to an embodiment of the present invention.

Similar to controllers for VSSM, controllers for fast or floating VDDM transition can also be configured in several ways. In a first example, as shown in FIG. 8, controller 800 can include transistors Q1 805, Q2 810, analogous to transistors Q1 705, Q2 710 shown in FIG. 7, but can also include two or more series connected diodes 815, 816 to provide a larger voltage difference ($V_{Flt1}+V_{Flt2}$) between VDD and VDDM. However, the invention is not limited to a series arrangement of diodes and other arrangements of diodes can be used. As previously stated, such a use of multiple transistors with known characteristics can provide greater flexibility in obtaining the desired voltages over a range of conditions.

Figure 9:
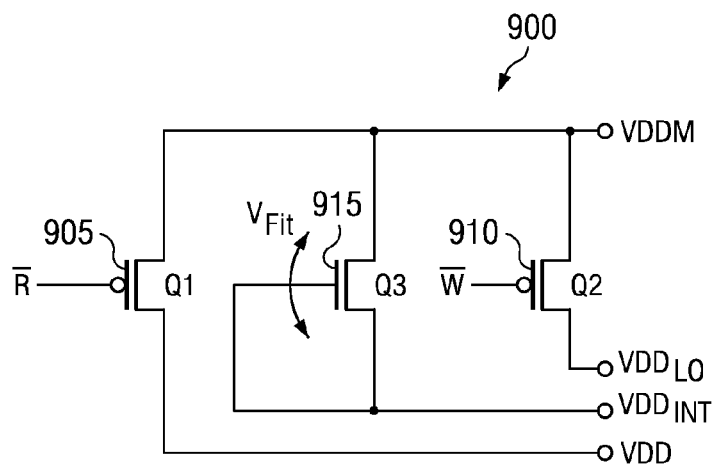
FIG. 9 shows a supply voltage controller for providing a selectable option of a fast or float transition for VDDM using a single MOS "diode" coupled to an intermediate VDD according to an embodiment of the present invention.

In another example, as shown in FIG. 9, controller 900 can be supplied with multiple VDD's to provide reference voltages for read, write, and standby. In FIG. 9, read transistor Q1 905 is still coupled to VDDM and VDD and write transistor Q2 910 is coupled to VDDM and $VDD_{LO}$. However, as previously discussed, float element 915 can be coupled to another voltage rather than VDD. As shown in FIG. 9, float element 915 can comprise a diode Q3 coupled to an intermediate VDD rather than VDD. Such a configuration can be provided when the requirements for read, write, standby, or other lines (bitline, wordline) vary significantly from each other or cannot be controllable provided by deriving them all from a single VDD. Such a configuration can also be used when the integrated circuit already provides such intermediate voltages and the operation circuit can be simplified by utilizing such supply voltages. Subsequent operation of controller 900 is analogous to that of controllers 700 and 800, with the exception that the desired standby VDD will be instead be equal to the sum of the intermediate VDD and the voltage drop across float element 915.

Figure 10:
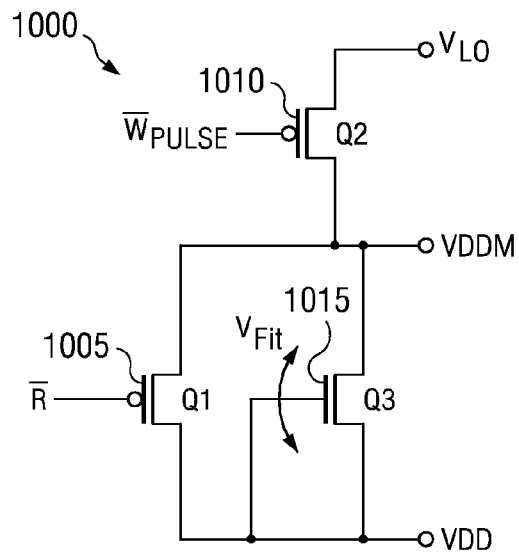
FIG. 10 shows a supply voltage controller for providing a selectable option of a fast or float transition for VDDM using a single MOS "diode" coupled to VDD and a low voltage write pulse according to an embodiment of the present invention.

In yet another example, as shown in FIG. 10, a controller 1000 for VDDM can be provided for circumstances in which it is not necessary for a write signal to be provided during the entire write operation, such as when the standby VDDM is generally sufficient to ensure writeability and stability for the memory cells. In such cases, an inverted write pulse signal generated at the start of a write operation, can be provided for a brief time sufficient to bring VDDM to a value adequate for a write operation, and the float element can maintain VDDM at an adequate voltage for the remainder of the write operation, similar to the controller shown in FIG. 6. Such a configuration can generate a sufficiently high VDDM without having to actively provide a W-bar signal throughout the write operation, further reducing power consumption of the SRAM. The pulse circuit can raise VDDM by pulling against the float element, or can lower VDDM to (or toward) some supply voltage, e.g. $VDD_{LO}$ or VDD, with the float element turned off. Having the pulse circuit pull against the float element has the advantage of eliminating the need to switch the float element and also dose not require a separate supple voltage such as $VDD_{LO}$, but may incur some inaccuracy in the voltage obtained by the pulse.

Figure 11:
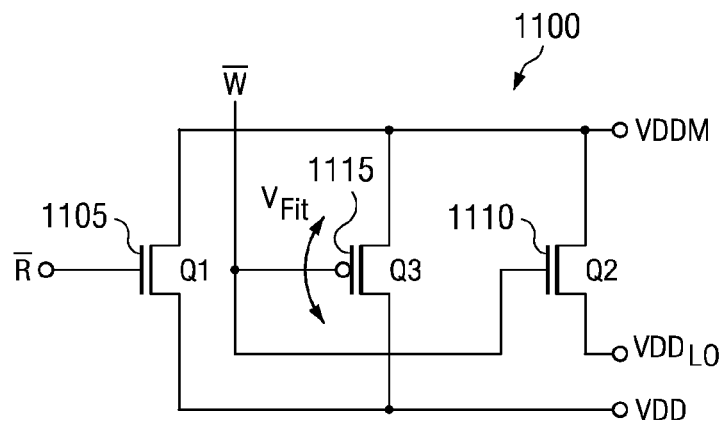
FIG. 11 shows a supply voltage controller for providing a selectable option of a fast or float transition for VDDM using a float MOS transistor coupled to VDD according to an embodiment of the present invention.

In still another example, as shown in FIG. 11, a controller 1100 for VDDM can be provided similar to the circuit shown in FIG. 3. As shown in FIG. 11, the float element 1115 can be a float PMOS transistor 1115. In particular, float transistor 1115 can be a pull-down PMOS transistor Q3 connected in parallel with the second transistor Q2 1110. However, as in FIG. 3, the gate of float transistor Q3 1115 is coupled to a write control signal (W-bar) instead of the read control signal (R-bar) Therefore, during a read operation, R-bar goes low, turning transistor Q1 1105 ON. Consequently, VDDM is raised to VDD, providing the necessary high VDDM level to improve readability. After the read operation is complete, the float transistor Q3 1115 is already on by W-bar being high during the read operation. However, because the float transistor Q3 1115 is a pull-down transistor and has a low conductance, VDDM is not simply shorted to $VDD_{LO}$. Instead, a voltage difference ($V_{Flt}$) slowly develops across the float transistor Q3 1115 as it attempts to reach an equilibrium state. VDDM begins to fall below VDD, where VDDM is the sum of the $V_{Flt}$ and VDD. Eventually VDDM is lowered to the standby VDDM where the standby VDDM is approximately VDD plus the Vtn of the float NMOS Q3 1115.

According to some embodiments of the present invention, voltage transitions for VDDM and/or VSSM can also be selectively applied to only a subset of the memory cells in the SRAM array or can be applied to the entire SRAM array. Thus, subsets of the memory array can be used to define blocks. A supply voltage controller for implementing these embodiments of present invention can be entirely centralized, partly centralized, or be entirely local. Accordingly, the selected VDDM or VSSM transition can be applied globally across the entire SRAM, centrally determined but generated locally, or determined and generated locally in a plurality of portions of the SRAM. The local embodiment permits further efficiency by better customizing the VDDM and VSSM to local conditions in the SRAM, however, the invention is not limited to just the local embodiment.

Figure 12:
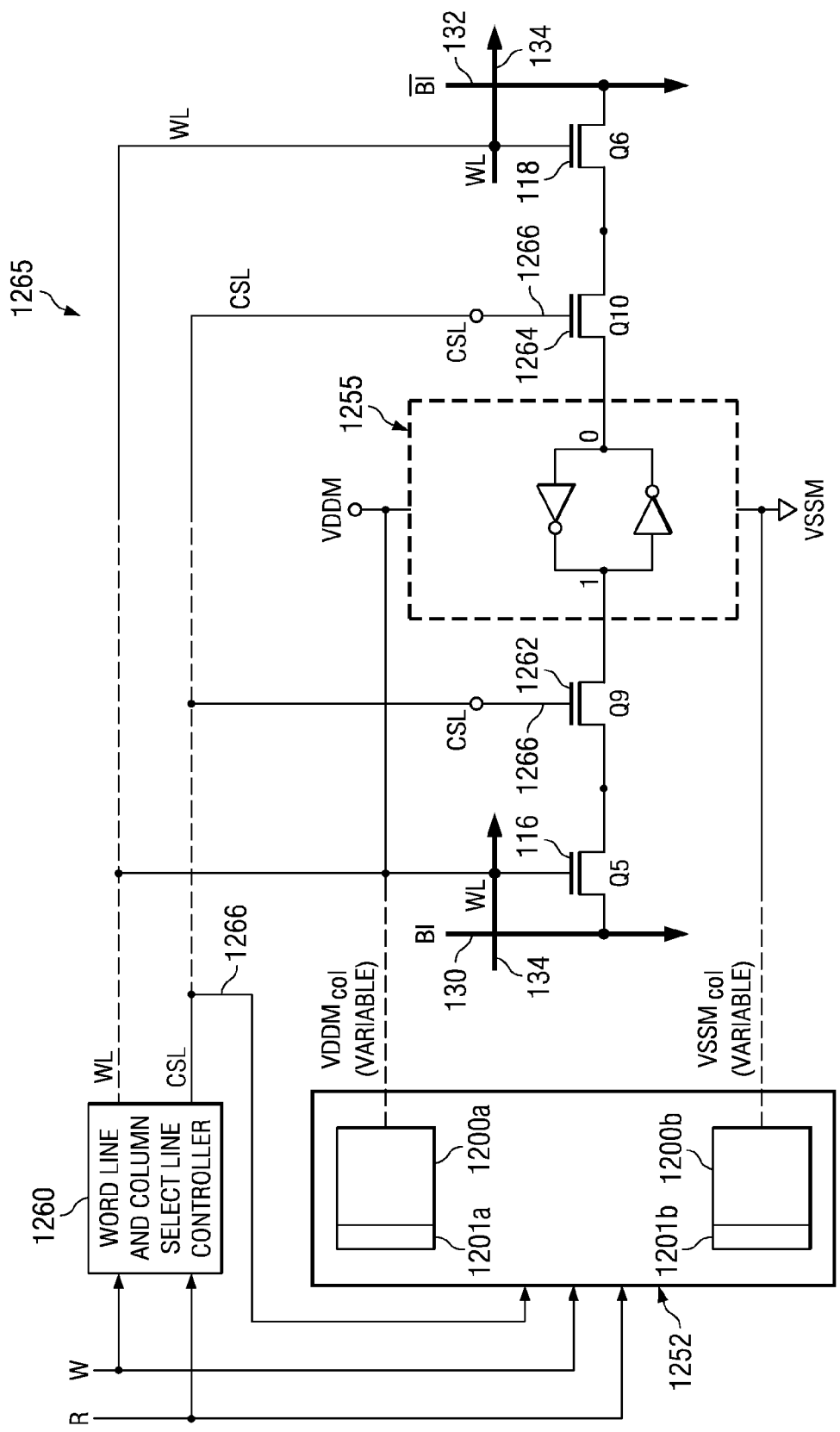
FIG. 12 shows a schematic of a supply voltage controller for a column of a memory array according an embodiment of the present invention.

In one embodiment of the present invention, as shown in FIG. 12, an integrated circuit, including a memory array 1265, can include a word line and column select line driver or controller 1260. Controller 1260 can be operable to drive a word (or row select) line WL 134 and/or a column select line CSL 1266, respectively, to allow access to specific blocks of memory cells in a memory array 1265. For example, in some embodiments, a block of a memory array can comprise one or more columns of the array 1265, where each column includes one or more instances of memory cell 1255.

As shown in FIG. 12, to access the instances of memory cell 1255 in a column, a high WL 134 signal can be utilized to turn ON pass transistors Q5 116 and Q6 118 associated all instances of the memory cell 1255 in the array 1265. Additionally, a high CSL 1266 signal can utilized to turn ON pass transistors Q9 1262 and Q10 1264 for each memory cell 1255 associated with a specific column. Accordingly, once the pass transistors Q5 116, Q6 118, Q9 1262, and Q10 1264 have been turned ON for each memory cell 1255 in a selected column, each memory cell 1255 can be accessed by bitlines 130, 132 to set or reset the stored value in the memory cell 1255, as previously described in FIG. 1.

In some embodiments of the present invention, the column select signal generated by controller 1260 on CSL line 1266 can also be coupled to a column supply voltage controller 1252 to select fast or floating voltage transitions for particular columns. Therefore, rather than providing a single supply voltage controller for the array 1265, a column supply voltage controller 1252 can be provided for each column in the array 1265. Therefore, each column supply voltage controller 1252 can be configured to receive an additional control signal on CSL line 1266 to allow each column supply voltage controller 1252 to respond differently based on whether the associated column has been selected for a particular operation. For example, when columns are addressed for a write cycle. the VDDM of addressed columns can be lowered and the VDDM of unaddressed columns can be raised. If the cycle following such a write cycle is a read cycle, the lowered column VDDM can be switched to the higher VDDM level. If the cycle following such a write cycle is an inactive cycle, the VDDM of all the columns can be floated to a lower value. Various methods of using a control signal to activate or deactivate a circuit are well-known in the art and will not be discussed here.

In another similar embodiment, the blocks of an array can comprise one or more rows of the array. When a row is addressed for either a read cycle or a write cycle, the VDDM and/or VSSM for the addressed block can be switched to the appropriate voltage(s) for either a read or a write operation. If the row is not addressed in the following cycle, the VDDM and/or VSSM of the row can be allowed to float to a different voltage, reducing power consumption. In such embodiments, a row supply voltage controller can be used with the row select (word line) signal.

Although no particular design for SRAM cells or arrays has been described in accordance with the circuits and methods of the present invention, it will be apparent to one of ordinary skill in the art that cell and transistor technology variations, including, but not limited to, array, bitline, or wordline orientation variations are all included in the scope of the present invention.

The invention is also not limited to the use of silicon wafers, and may be implemented in association with the manufacture of various semiconductor devices, SRAM memory devices, or other such devices, wherein the design and optimization of an SRAM cell, potential data upsets, and power consumption is an issue, where cell access is to be limited only to the memory area being used, and wherein the various aspects thereof may be applied. The invention, as previously described, is also not limited to SRAM memory devices and can be used with any other type of integrated circuit that can benefit from selecting between fast or floating voltage transitions.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

What is claimed is:

1. An integrated circuit, comprising:
    a supply voltage controller operable to receive a plurality of control signals and at least a first circuit supply voltage and to output at least one variable supply voltage to at least one supply terminal of said integrated circuit,
    wherein said controller is operable to switch said variable supply voltage to a first voltage level when said control signals define a first operation and to a second voltage level different from said first voltage level when said control signals define a second operation, and
    wherein said controller is operable to float said variable supply voltage to a third voltage level different from said first voltage level when said control signals define a third operation.

2. The integrated circuit of claim 1, wherein a difference between said second voltage level and said third voltage level is greater than 5 mV and less than 100 mV.

3. The integrated circuit of claim 1, wherein said supply voltage controller is further operable to receive at least a second circuit supply voltage different from said first circuit supply voltage, and wherein a difference between said first voltage level and said second voltage level is less than half the difference between said first circuit supply voltage and said second circuit supply voltage.

4. The integrated circuit of claim 1, wherein said integrated circuit comprises a plurality of memory cells.

5. The integrated circuit of claim 4, wherein said plurality of memory cells comprise SRAM cells.

6. The integrated circuit of claim 1, wherein said controller comprises:
    at least one first MOS transistor operable to bias said supply terminal to said first voltage level during said first operation, wherein said first MOS transistor has a gate coupled to receive at least one of said control signals defining said first operation;
    at least one second MOS transistor operable to bias said supply terminal to said second voltage level during said second operation, said second MOS transistor having a gate coupled to receive at least one of said control signals defining said second operation; and
    at least one voltage drop element connected between said supply terminal and a reference voltage operable to float said supply terminal to said third voltage level during said third operation.

7. The integrated circuit of claim 6, wherein said voltage drop element comprises a diode connected MOS transistor.

8. The integrated circuit of claim 6, wherein said control signal defining said second operation is provided for a length of time less than or equal to a length of time of said second operation, wherein a voltage drop is forced across said voltage drop element.

9. The integrated circuit of claim 6, wherein said voltage drop element comprises a third MOS transistor wherein said third MOS transistor has its gate coupled to receive said control signal defining said second operation and its drain connected to said supply terminal, wherein said third MOS transistor is operable to be turned off during said second operation.

10. The integrated circuit of claim 6, wherein the voltage drop element comprises a low drop-out (LDO) voltage regulator coupled to said reference voltage.

11. The integrated circuit of claim 1, wherein said integrated circuit comprises an array of memory cells, and wherein said controller is operable to switch said variable supply voltage for only a subset of said cells in said array to said first voltage level when said control signals define a first operation for said subset and to said second voltage level when said control signals define a second operation for said subset, and wherein said third voltage level defines an inactive operation for said subset.

12. The integrated circuit of claim 11, wherein said array is arranged in a plurality of rows and columns, and wherein said cells in said subset located in at least one of said columns and at least one of said rows.

13. A method of operating an integrated circuit, said method comprising the steps of:
    applying a first voltage level when a plurality of control signals define a read operation and a second voltage level different from said first voltage level when said control signals define a write operation to a supply voltage terminal of said integrated circuit, and
    floating said variable supply voltage terminal to a third voltage level when said plurality of control signals define a standby state.

14. The method of claim 13, wherein a difference between said second voltage level and said third voltage level is greater than 5 mV and less than 100 mV.

15. The method of claim 13, wherein said third voltage level is obtained with a voltage drop element and a voltage is forced across said voltage drop element during at least a portion of a write cycle.

16. The method of claim 13, wherein a difference between said first voltage level and said second voltage level is less than half the difference between a first circuit supply voltage and a second circuit supply voltage of said integrated circuit.

17. The method of claim 13, wherein said integrated circuit comprise SRAM cells.

18. The method of claim 13, wherein a float element couples said supply voltage terminal to a reference voltage.

19. The method of claim 18, wherein said float element is operable to be turned off during said write operation.

20. The method of claim 13, wherein said integrated circuit comprises a plurality of memory cells arranged in a plurality of blocks, the method further comprising:
- switching only a subset of said blocks to said first voltage level when the plurality of control signals define a read operation for said subset of said blocks and to said second voltage level when said control signals define a write operation for said subset of said blocks.

21. An integrated circuit, comprising:
- a memory array comprising a plurality of SRAM memory cells arranged in a plurality of rows and columns, said array also having a plurality of word lines for accessing rows of cells and a plurality bit lines for accessing columns of cells; and
- a supply voltage controller operable to receive control signals indicating a read operation or write operation and at least one circuit supply voltage and to output at least one variable supply voltage to a supply terminal of said memory cells, wherein said supply voltage controller is operable to switch said variable supply voltage to a first voltage level when said control signals indicate said read operation and to a second voltage level different from said first voltage level when said control signals define said write operation, and to float said variable supply voltage to a third voltage level when said control signals indicate a standby operation for said memory cells.

22. The integrated circuit of claim 21, wherein said supply voltage controller comprises:
- at least one first MOS transistor operable to bias said supply terminal to said first voltage level during said read operation, wherein said first MOS transistor has a gate coupled to receive at least one of said control signals defining said read operation;
- at least one second MOS transistor operable to bias said supply terminal to said second voltage level during said write operation, said second MOS transistor having a gate coupled to receive at least one of said control signals defining said write operation; and
- at least one voltage drop element operable to float said supply terminal to said third voltage level during said standby operation, said third voltage level comprising a sum of a voltage drop across said voltage drop element and a reference voltage level during said standby operation.

23. The integrated circuit of claim 22, wherein said voltage drop element comprises a diode connected MOS transistor.

24. The integrated circuit of claim 21, wherein said controller is operable to switch said variable supply voltage for only a subset of said cells of said array to said first voltage level when said control signals define a read operation for said subset and to said second voltage level when said control signals define a write operation for said subset.

25. The integrated circuit of claim 24, wherein said cells in said subset are located in at least one of said columns and at least one of said rows.

* * * * *